(12) United States Patent
Ebisuno et al.

(10) Patent No.: US 9,960,223 B2
(45) Date of Patent: May 1, 2018

(54) ACTIVE-MATRIX DISPLAY DEVICE

(71) Applicant: JOLED INC., Tokyo (JP)

(72) Inventors: Kohei Ebisuno, Tokyo (JP); Masafumi Matsui, Tokyo (JP); Hitoshi Tsuge, Tokyo (JP)

(73) Assignee: JOLED INC., Tokyo (JP)

( * ) Notice: Subject to any disclaimer, the term of this patent is extended or adjusted under 35 U.S.C. 154(b) by 0 days. days.

(21) Appl. No.: 15/492,464

(22) Filed: Apr. 20, 2017

(65) Prior Publication Data

US 2017/0309696 A1 Oct. 26, 2017

(30) Foreign Application Priority Data

Apr. 26, 2016 (JP) ................. 2016-088524

(51) Int. Cl.
*H01L 27/32* (2006.01)
*H01L 51/52* (2006.01)

(52) U.S. Cl.
CPC ...... *H01L 27/3276* (2013.01); *H01L 27/3265* (2013.01); *H01L 51/5206* (2013.01)

(58) Field of Classification Search
None
See application file for complete search history.

(56) References Cited

U.S. PATENT DOCUMENTS

| 6,512,504 | B1 | 1/2003 | Yamauchi et al. |
| 6,580,094 | B1 | 6/2003 | Yamazaki et al. |
| 2002/0024493 | A1* | 2/2002 | Ozawa ................. G09G 3/3233 345/92 |
| 2003/0132900 | A1 | 7/2003 | Yamauchi et al. |
| 2003/0201448 | A1 | 10/2003 | Yamazaki et al. |
| 2005/0056832 | A1 | 3/2005 | Yamazaki et al. |
| 2005/0184936 | A1 | 8/2005 | Yamauchi et al. |
| 2006/0226788 | A1* | 10/2006 | Ogawa ................. G09G 3/3233 315/169.3 |
| 2008/0018566 | A1 | 1/2008 | Yamauchi et al. |
| 2008/0029765 | A1 | 2/2008 | Yamazaki et al. |
| 2011/0090209 | A1 | 4/2011 | Yamauchi et al. |

(Continued)

FOREIGN PATENT DOCUMENTS

| JP | 2001-195016 | 7/2001 |
| JP | 2009-080491 | 4/2009 |
| WO | 98/36407 | 8/1998 |

*Primary Examiner* — Duy T Nguyen
*Assistant Examiner* — Bo Bin Jang
(74) *Attorney, Agent, or Firm* — Greenblum & Bernstein, P.L.C.

(57) ABSTRACT

An active-matrix display device according to the present disclosure includes a plurality of pixels. Each of the pixels includes: a drive transistor disposed on a substrate; and an organic EL element that is caused by the drive transistor to emit light and includes an AM layer disposed above the substrate and a transparent electrode layer disposed above the AM layer. The active-matrix display device further includes: a source line that supplies data to the pixels; and a power supply line that supplies electric power to the pixels. The power supply line is shared by, among the plurality of pixels, two pixels that are adjacent to each other in a second direction that crosses a first direction in which the power supply line is extended. The source line and the AM layer are disposed not to overlap each other in a plan view of the substrate.

5 Claims, 8 Drawing Sheets

(56) References Cited

U.S. PATENT DOCUMENTS

2012/0061718 A1   3/2012   Yamazaki et al.
2015/0187822 A1   7/2015   Yamauchi et al.
2016/0197105 A1   7/2016   Yamauchi et al.

* cited by examiner

ACTIVE-MATRIX DISPLAY DEVICE

CROSS REFERENCE TO RELATED APPLICATION

The present application is based on and claims priority of Japanese Patent Application No. 2016-088524 filed on Apr. 26, 2016. The entire disclosure of the above-identified application, including the specification, drawings and claims is incorporated herein by reference in its entirety.

FIELD

The present disclosure relates to an active-matrix display device that includes a plurality of pixels arranged in a matrix.

BACKGROUND

An active-matrix display device (a display panel), such as an organic electroluminescence (OLED: Organic light-emitting diode) display device, includes a display region in which a plurality of pixels are arranged in a matrix along row and column directions. Each of the pixels is provided with: a switching element and a drive element which are formed from thin film transistors (TFTs); a pixel circuit which is formed from, for example, a capacitor; and a light-emitting element, such as an organic EL element.

In general, the active-matrix display device is provided with a power supply line for each pixel row that has a plurality of pixels. The power supply line supplies a power supply voltage to each of the pixels belonging to the same pixel row. The power supply line is disposed, for example, between pixel columns adjacent to each other.

As an example of a configuration of a bottom-emission active-matrix display device, a configuration in which two pixels are laid out to be symmetrical with respect to the power supply line that is shared by these two pixels is known (see Patent Literature [PTL] 1, for example). Such a configuration allows the required number of lines to be reduced and thus can enhance the image quality (display quality).

CITATION LIST

Patent Literature

[PTL 1] Japanese Unexamined Patent Application Publication No. 2009-80491

SUMMARY

Technical Problem

However, when this configuration having the symmetrical pixel layout is applied to a top-emission active-matrix display device, in which a source line (data line) and an electrode layer of a light-emitting element overlap each other in the direction of lamination, a parasitic capacitance occurs to the overlapping portion. Thus, a voltage variation of the source line is transferred to a node in a pixel via this parasitic capacitance. This causes crosstalk to occur along the extending direction of the source line, thereby degrading the display quality.

The present disclosure is conceived to solve the aforementioned problem and has an object to provide an active-matrix display device that is capable of enhancing the display quality.

Solution to Problem

To achieve the aforementioned object, an active-matrix display device according to an aspect of the present disclosure is an active-matrix display device including: a plurality of pixels arranged in a matrix, each of the plurality of pixels including: a drive element that is disposed on a substrate; and a light-emitting element that is caused by the drive element to emit light, and includes a metal electrode layer disposed above the substrate and a transparent electrode layer disposed above the metal electrode layer; a data line that is disposed on the substrate and supplies data to the plurality of pixels; and a power supply line that is disposed on the substrate and supplies electric power to the plurality of pixels, wherein the power supply line is shared by, among the plurality of pixels, two pixels that are adjacent to each other in a second direction that crosses a first direction in which the power supply line is extended, and the data line and the metal electrode layer are disposed not to overlap each other in a plan view of the substrate.

Advantageous Effects

With the active-matrix display device according to the present disclosure, the display quality can be enhanced.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT

Figure 1:
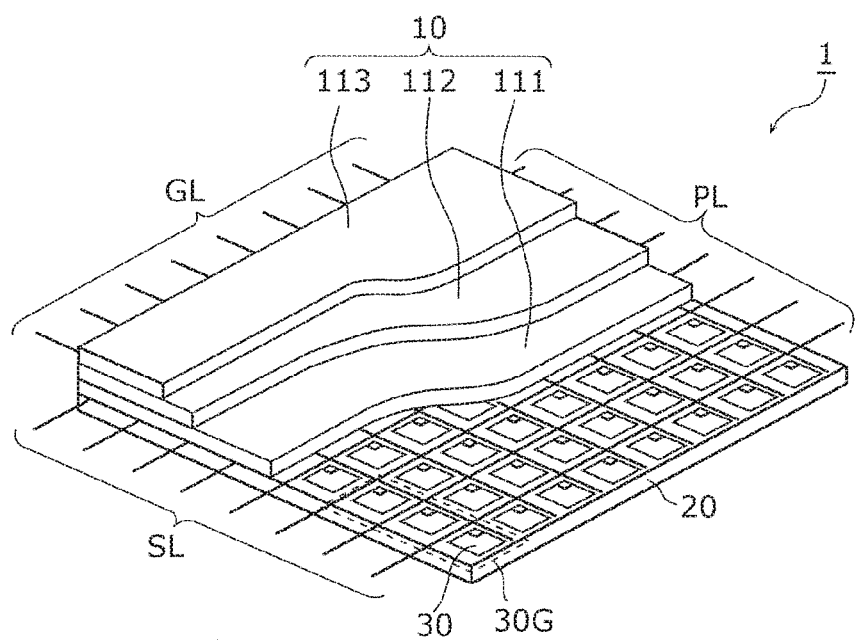
FIG. 1 is a partially-cutaway perspective view of an active-matrix display device according to an embodiment.

Hereinafter, an active-matrix display device according to an exemplary embodiment is described with reference to the accompanying drawings. It should be noted that the exemplary embodiment below describes only a preferred specific example. Therefore, the numerical values, structural elements, the arrangement and connection of the structural elements, and so forth described in the following exemplary embodiment are merely examples, and are not intended to limit the present disclosure. Thus, among the structural elements in the following exemplary embodiment, structural elements that are not recited in any one of the independent claims indicating top concepts according to the present disclosure are described as arbitrary structural elements.

It should be noted that the same reference numerals are given to the substantially same structural elements in the drawings. Note also that each of the drawings is only a schematic diagram and is not necessarily precise representation of, for example, the film thickness and the ratio of the sizes of the structural elements. Moreover, the terms "row direction" and "column direction" in the embodiment and the drawings are used for purposes of illustration and, thus, different two directions may be freely used. Furthermore, although the following describes an example in which the row and column directions are perpendicular to each other, these two directions do not necessarily need to be perpendicular to each other.

Embodiment

Firstly, a display device 1 according to the embodiment in the present disclosure is described, with reference to FIG. 1 to FIG. 4B. It should be noted that the display device 1 according to the present embodiment is an active-matrix organic EL display device (organic EL display panel) and includes a display region (a pixel unit) in which a plurality of pixels are arranged in a matrix along row and column directions.

[1. Overall Configuration]

A configuration of the display device 1 according to the present embodiment is described, with reference to FIG. 1. FIG. 1 is a partially-cutaway perspective view of the display device 1 according to the present embodiment.

As shown in FIG. 1, the display device 1 is an active-matrix display device that includes an organic EL element (an organic light-emitting element) 10, an active-matrix substrate 20, and a plurality of pixels 30 arranged in a matrix.

The organic EL element 10 is a light-emitting element that includes an anode metal (AM) layer 111 having an anode, an organic EL layer 112 having a light-emitting layer, and a transparent electrode layer 113 having a cathode. The AM layer 111, the organic EL layer 112, and the transparent electrode layer 113 are laminated in this order on the active-matrix substrate 20.

It should be noted that the light emission side of the display device 1 is described as being the upper side in the present embodiment. However, the light emission side of the display device 1 may not necessarily be the upper side in practical use. On this account, the light emission side of the display device 1 is not limited to the upper side in practical use.

The active-matrix substrate 20 includes: a plurality of gate lines GL extended in the row direction of the pixels 30; a plurality of source lines SL (data lines) extended in the column direction of the pixels 30; and a plurality of power supply lines PL extended in the column direction of the pixels 30. The active-matrix substrate 20 is a thin film semiconductor array device used for a display device, for example. The plurality of source lines SL and the plurality of gate lines GL are formed to be perpendicular to each other. Note that the plurality of power supply lines PL may be extended in the row direction of the pixels 30.

The pixels 30 are partitioned individually by the gate lines CL and the source lines SL that are perpendicular to each other. Each of the pixels 30 includes a pixel circuit that drives the organic EL element 10 that corresponds to the present pixel 30. In the present embodiment, each of the pixels 30 is a subpixel that corresponds to one of the three primary colors, red (R), green (C), and blue (B). Thus, a pixel 30G is formed from three pixels 30, which are the pixel 30 corresponding to B, the pixel 30 corresponding to R, and the pixel 30 corresponding to G. Here, the pixels corresponding to the same color are disposed adjacent to each other in the column direction.

The gate line GL is provided for each pixel row that is formed from a plurality of pixels 30 belonging to the same row. All the pixels 30 belonging to the pixel row that corresponds to the gate line CL are connected to a control circuit scanning-line drive circuit) via this gate line GL.

The source line SL is provided for each pixel column that is formed from a plurality of pixels 30 belonging to the same column. All the pixels 30 belonging to the pixel column that corresponds to the source line SL are connected to a control circuit (a signal-line drive circuit) via this source line SL.

In this way, the display device 1 according to the present embodiment adopts an active-matrix method by which display control is performed for each of the pixels 30.

[2. Circuit Configuration of Pixel]

Figure 2:
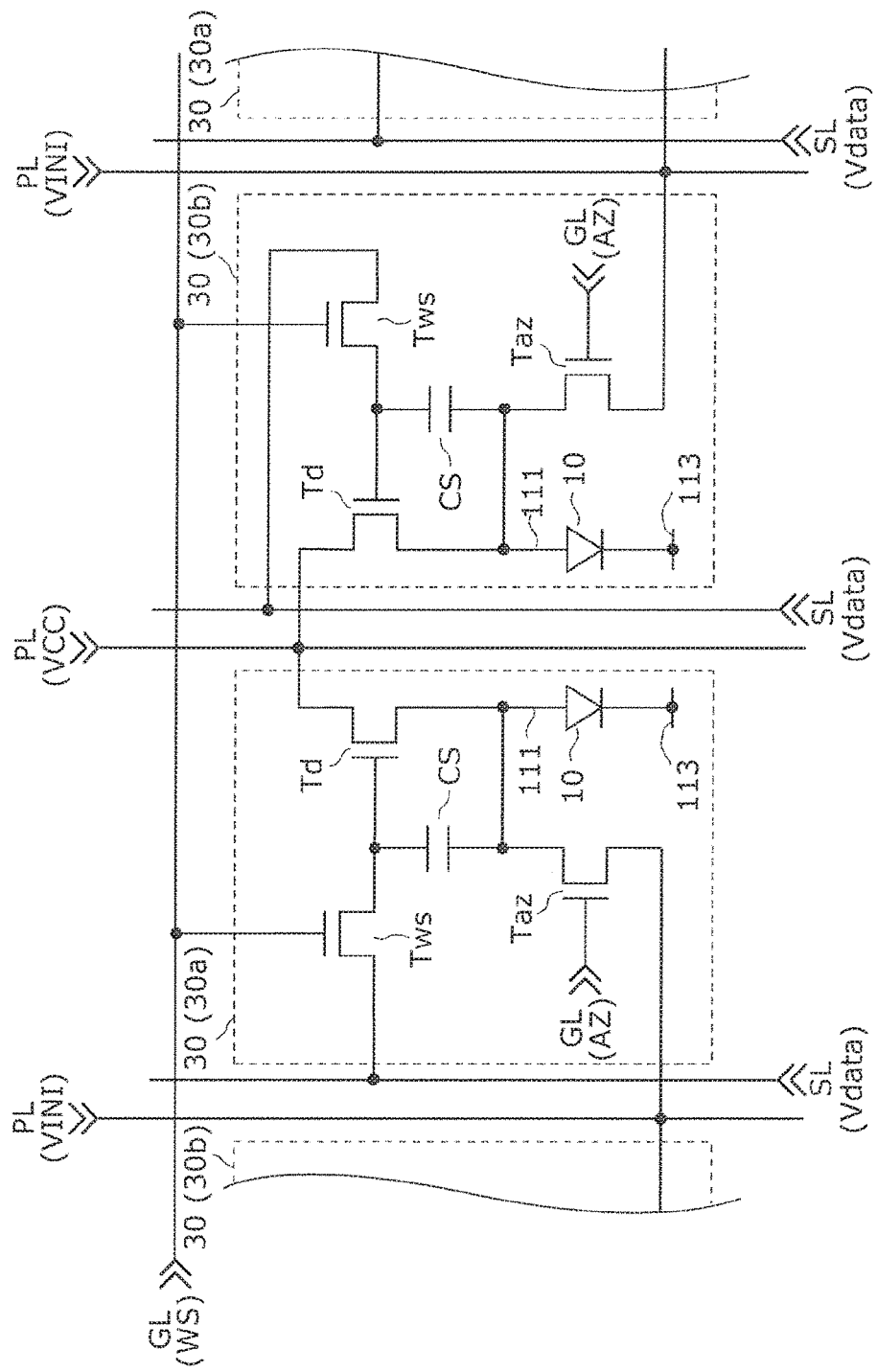
FIG. 2 is a circuit diagram showing a circuit configuration of pixel according to the embodiment.

Next, a circuit configuration of the pixel 30 is described. FIG. 2 is a circuit diagram showing the circuit configuration of the pixel 30 according to the present embodiment. To be more specific, FIG. 2 is a diagram showing two pixels 30 disposed adjacent to each other in the row direction.

As shown in FIG. 2, the pixel 30 in the display device 1 includes a drive transistor Td, transistors Tws and Taz, a capacitor CS, and the organic EL element 10. Furthermore, the pixel 30 is connected to the gate line GL, the source line SL, and the power supply line PL.

The drive transistor Td is a drive element that causes the organic EL element 10 to emit light by supplying the organic EL element 10 with a pixel current corresponding to a voltage stored in the capacitor CS.

The transistor Tws is a switching transistor used for writing, into the capacitor CS, a data voltage Vdata supplied from the source line SL. To be more specific, the transistor Tws switches a state between the source line SL and a first electrode of the capacitor CS between a conducting state and a non-conducting state, according to a WS signal supplied to the gate line GL.

The transistor Taz is a switching transistor used for initializing (auto-zeroing) a voltage of the capacitor CS. To be more specific, the transistor Taz switches a state between the power supply line PL supplied with an initialization voltage VINI and a second electrode of the capacitor CS between the conducting state and the non-conducting state, according to an AZ signal supplied to the gate line GL.

In the present embodiment, each of the drive transistor Td and the transistors Tws and Taz is formed from an n-channel thin film transistor (n-channel TFT).

The capacitor CS holds a voltage corresponding to data supplied from the source line SL (this data refers to the data voltage Vdata here). In the present embodiment, the capacitor CS holds a threshold voltage Vth of the drive transistor Td, and also holds a voltage expressed as Vdata+Vth where the threshold voltage Vth of the drive transistor Td is compensated by the data voltage Vdata supplied from the source line SL. To be more specific, the capacitor CS has the first electrode that is connected to a gate of the drive transistor Td and the second electrode that is connected to a source of the drive transistor Td.

The organic EL element 10 is a light-emitting element that emits light according to a pixel current supplied from the drive transistor Td. The organic EL element 10 has the anode (the positive electrode) that is formed from the AM layer 111 and the cathode (the negative electrode) that is formed from the transparent electrode layer 113.

The gate line GL supplies timing signals (gate voltages), such as the WS and AZ signals, to the plurality of pixels 30. In the present embodiment, the gate line GL supplies these timing signals to each of the pixels 30 that belong to the same pixel row.

The source line SL is a data line that supplies data to the plurality of pixels 30. In the present embodiment, the source line SL supplies the data voltage Vdata corresponding to a gray level, to each of the pixels 30 that belong to the same pixel column.

The power supply line PL supplies electric power to the plurality of pixels 30. In the present embodiment, the power supply line PL supplies a power supply voltage VCC or the initialization voltage VINI to each of the pixels 30 that belong to the same pixel column. More specifically, the power supply line PL includes: a first power supply line for supplying a current to the organic EL element 10 (that is, the power supply line for supplying the power supply voltage VCC); and a second power supply line for supplying the initialization voltage VINI that initializes the voltage of the capacitor CS.

In the pixel 30 configured in this way, when the AZ signal causes a state of the transistor Taz to change from an On state to an Off state, the capacitor CS detects and holds the threshold voltage Vth of the drive transistor Td. Following this, when the WS signal brings the transistor Tws into the On state and thereby the data voltage Vdata is supplied, the capacitor CS holds the voltage expressed as Vdata+Vth where the threshold voltage Vth is compensated for. With this, the drive transistor Td supplies the organic EL element 10 with the pixel current corresponding to the data voltage Vdata instead of corresponding to the threshold voltage Vth of the present drive transistor Td. As a result, the organic EL element 10 can emit light with a luminance corresponding to the gray level indicated by the data voltage Vdata.

Here, each of the power supply lines PL is shared by two pixel columns disposed adjacent to each other. To be more specific, the power supply line PL for supplying the power supply voltage VCC and the power supply line PL for supplying the initialization voltage VINI are disposed alternately every other pixel column. Each of these power supply lines is shared by the two pixel columns.

More specifically, the power supply line PL is shared by two pixels among the plurality of pixels 30. Here, the two pixels are adjacent to each other in a second direction (a pixel row direction in the present embodiment) that crosses a first direction (a pixel column direction in the present embodiment) in which the power supply line PL is extended. Hereinafter, one of the two pixels 30 that share the power supply line PL may be referred to as a pixel 30a and the other may be referred to as a pixel 30b, for convenience of description.

[3. Wiring Configuration of Pixel]

Figure 3:
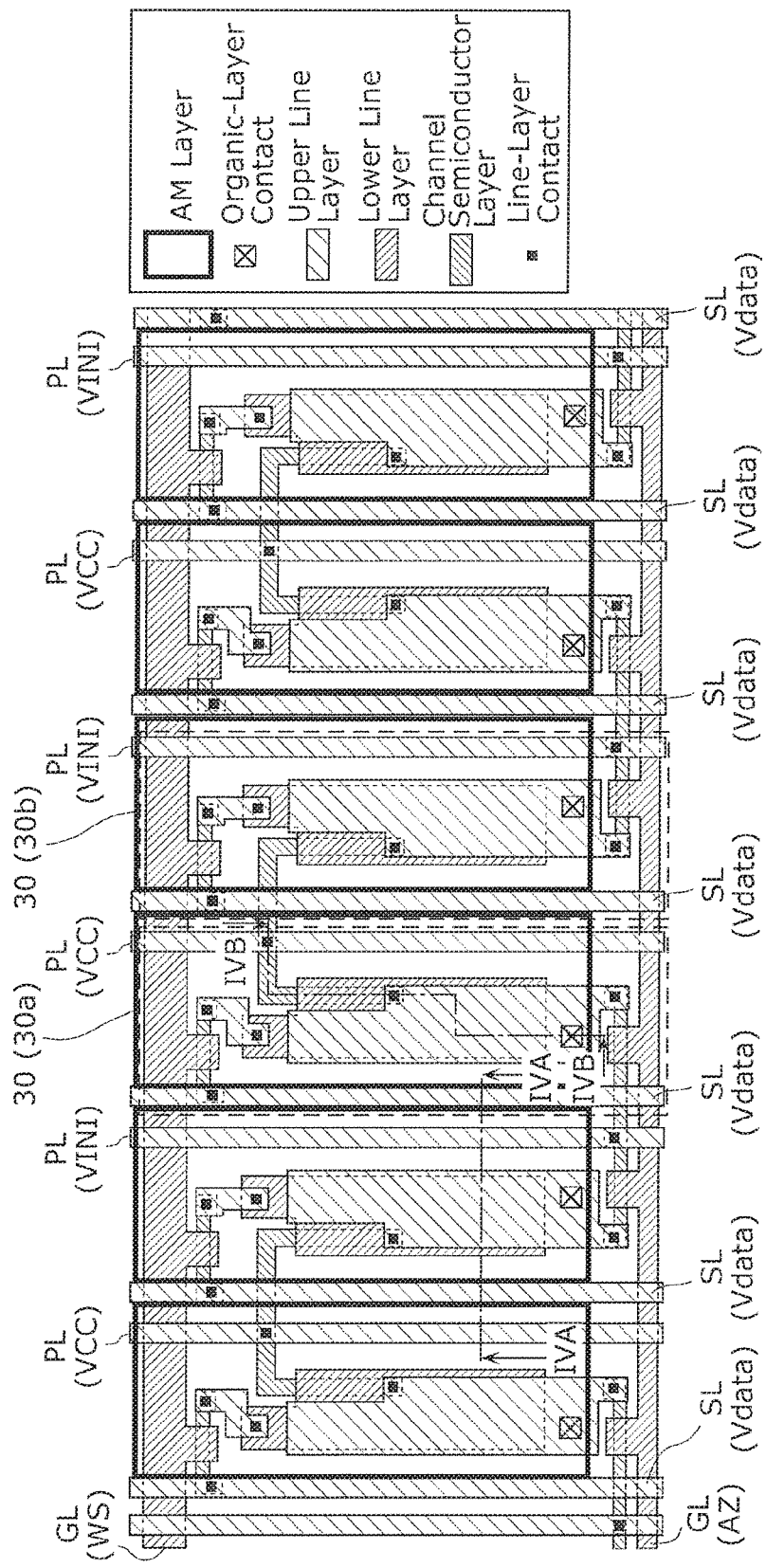
FIG. 3 is a top view showing a wiring layout of the pixel according to the embodiment.
Figure 4A:
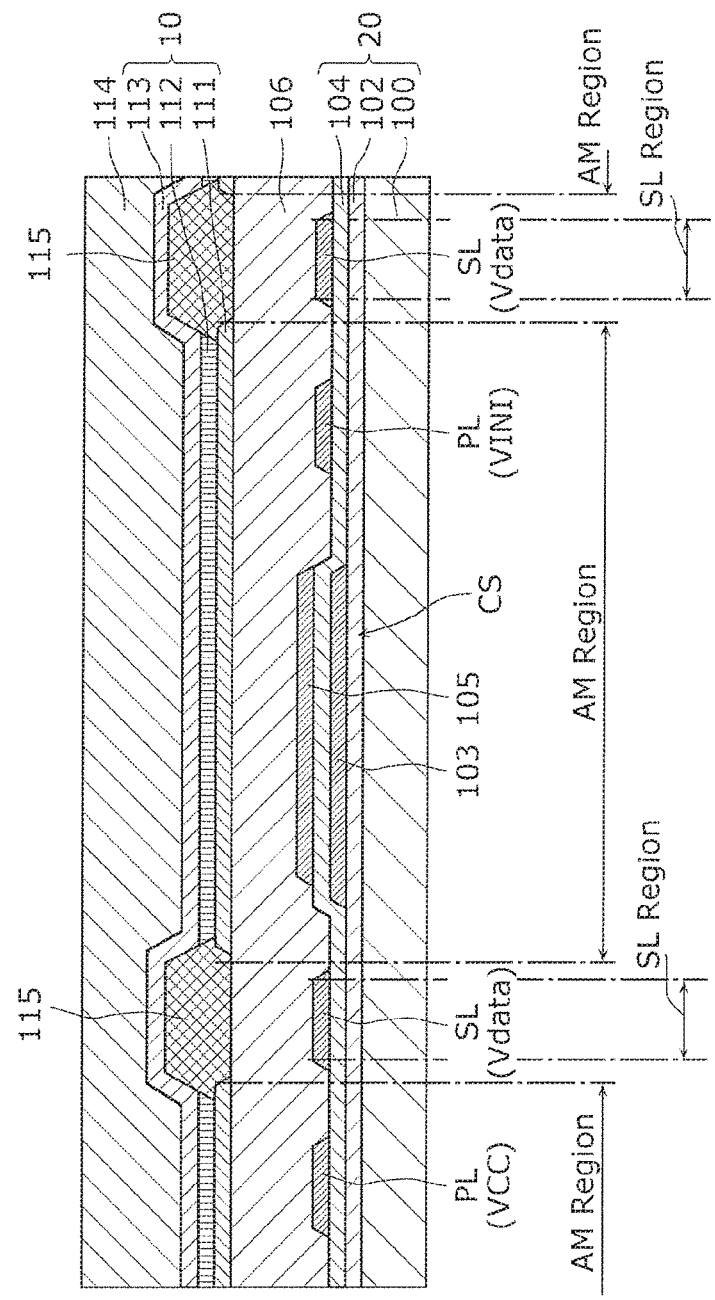
FIG. 4A is a cross-sectional view (taken along the line IVA-IVA of FIG. 3) showing a pixel configuration according to the embodiment.
Figure 4B:
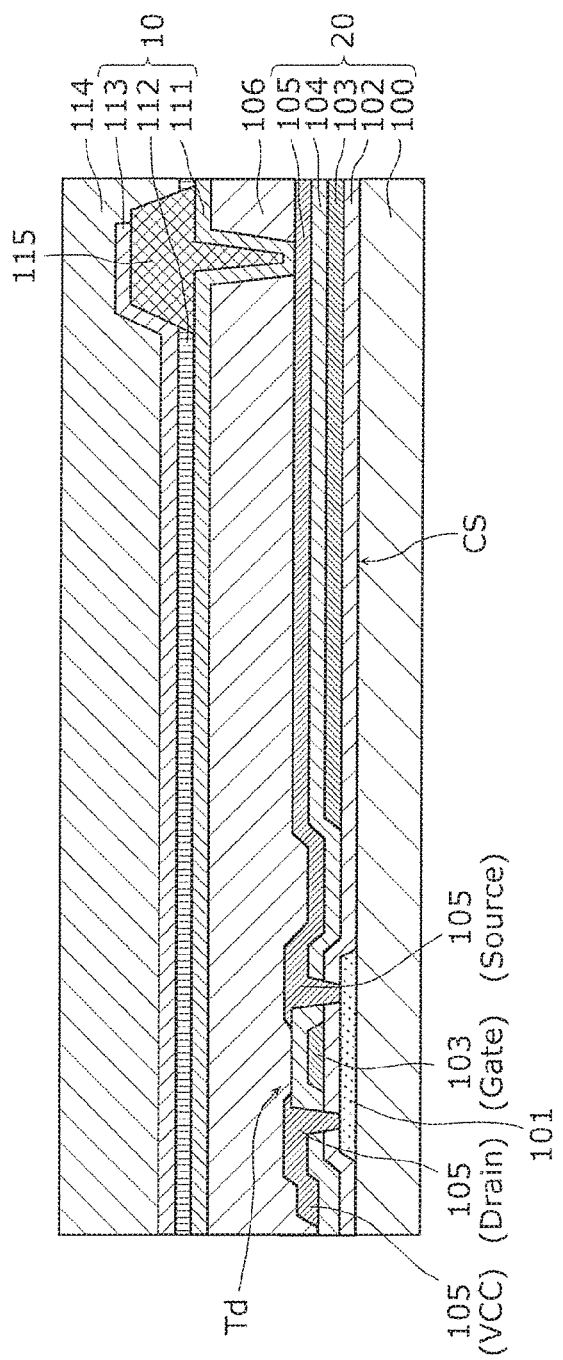
FIG. 4B is a cross-sectional view (taken along the line IVB-IVB of FIG. 3) showing a pixel configuration according to the embodiment.

Next, a wiring configuration of the pixel 30 included in the display device 1 according to the present embodiment is described, with reference to FIG. 3 to FIG. 4B.

FIG. 3 is a top view showing a wiring layout of the pixel 30 included in the display device 1 according to the present embodiment. The diagram of FIG. 3 shows the configuration viewed from the light emission side. To be more specific, FIG. 3 is a top view of a lower line layer 103, a channel semiconductor layer 101, an upper line layer 105, and the AM layer 111 that are shown in FIG. 4A and FIG. 46 described later. Note that FIG. 3 is a transparent view illustrating only the outline of the AM layer 111 and thereby showing the inner structure.

As shown in FIG. 3, the power supply line PL for supplying the power supply voltage VCC and the power supply line PL for supplying the initialization voltage VINI are disposed alternately every other pixel 30 along the row direction of the pixels 30. To be more specific, these power supply lines PL are disposed at equal pitches along the aforementioned row direction.

Moreover, as with the power supply lines PL, the plurality of source lines SL are disposed at equal pitches along the aforementioned row direction.

Furthermore, the layout of the two pixels 30 is repeated along the row direction to form the plurality of pixels 30. More specifically, the layout of the plurality of pixels 30 is formed by repetition of the layout of a pair of the pixels 30a and 30b in the row direction.

Moreover, each of the pixel 30a and the pixel 30b that share the power supply line PL includes a circuit element having the drive transistor Td. Here, the circuit elements of the pixels 30a and 30b are disposed to be symmetrical with respect to this power supply line PL. To be more specific, the drive transistor Td, the transistors Tws and Taz, and the capacitor CS of the pixel 30a are disposed to be symmetrical to those of the pixel 30b, with respect to the power supply line PL. Thus, the plurality of pixels 30 have the pixel layout (the symmetrical pixel layout) in which the pixels are roughly symmetrical with respect to the power supply line PL except for the following point.

To be more specific, each of the source lines SL is disposed at a location where the source line SL is not symmetrical to the power supply line PL. On this account, the pixel 30a and the pixel 30b have the pixel layouts that are not symmetrical with respect to the source line SL.

More specifically, the source line SL is disposed on the left-hand side of each of the pixel 30a and the pixel 30b, as shown in FIG. 3. For this reason, the line that connects the transistor Tws to the source line SL in each of the pixel 30a and the pixel 30b is extended from the transistor Tws toward the left-hand side. Thus, the layouts of the pixel 30a and the pixel 30b, including the layout of this line, are not symmetrical with respect to the power supply line PL.

Hereinafter, the wiring configuration of the pixel 30 is described in detail, with further reference to FIG. 4A and FIG. 4B.

Each of FIG. 4A and FIG. 4B is a cross-sectional view of the configuration of the pixel 30 according to the present embodiment. To be more specific, FIG. 4A is a cross-sectional view taken along the line IVA-IVA of FIG. 3. FIG. 4B is a cross-sectional view taken along the line IVB-IVB of FIG. 3. Note that, in each of these cross-sectional views, the structural elements may be partially reduced in width for the sake of simplicity.

As shown in FIG. 4A and FIG. 4B, the display device 1 is a top-emission display device which includes the active-matrix substrate 20 and the organic EL element 10 that are laminated in this order from the bottom.

As shown in FIG. 4A and FIG. 4B, the display device 1 according to the present embodiment has a laminated structure. To be more specific, the laminated structure includes a substrate 100 and the following that are sequentially laminated from the substrate 100 side: the channel semiconductor layer 101; a gate insulating layer 102; the lower line layer 103; a passivation layer 104; the upper line layer 105; a flattening layer 106; the AM layer 111; the organic EL layer 112; the transparent electrode layer 113; a sealing material layer 114; and a bank 115. It should be noted that although not shown in the drawings, the display device 1 further includes, for example, a counter substrate that is bonded to the laminated structure and a protection film that protects the sealing material layer 114.

The active-matrix substrate 20 in the display device 1 having the structure described above is configured with the substrate 100, the channel semiconductor layer 101, the gate insulating layer 102, the lower line layer 103, the passivation layer 104, and the upper line layer 105. Moreover, the organic EL element 10 is configured with the AM layer 111, the organic EL layer 112, and the transparent electrode layer 113.

The substrate 100 is a glass substrate, for example. It should be noted that the substrate 100 may be a flexible substrate formed from resin.

The channel semiconductor layer 101 has a channel and is provided for each of the transistors (the drive transistor Td and the transistors Tws and Taz). The channel is formed in the shape of an island by patterning a semiconductor film, such as a silicon semiconductor film or an oxide semiconductor film.

The gate insulating layer 102 is provided for each of the transistors and formed on the entire display region in a manner that the channel semiconductor layer 101 is covered.

The lower line layer 103 forms, for example, the gate line GL and the gate electrode (or a so-called gate metal [GM]) of each of the transistors. The gate line GL and the gate electrode are formed in predetermined shapes by patterning one and the same metal film.

The passivation layer 104 is an interlayer insulating layer that insulates the lower line layer 103 and the upper line layer 105 from each other.

The upper line layer 105 forms, for example, the power supply line PL, the source line SL, and the source-drain electrodes (or a so-called source-drain (SD) metal) of each of the transistors. The power supply line PL, the source line SL, and the source-drain electrodes of each of the transistors are formed in predetermined shapes by patterning one and the same metal film.

The flattening layer (interlayer insulating layer) 106 is formed between the active-matrix substrate 20 and the organic EL element 10 in a manner that the organic EL element 10 has, for example, a flatness. For example, a material that is low in viscosity, such as an acrylic material, is used for the flattening layer 106.

The AM layer 111 is a metal electrode layer that forms the anode of the organic EL element 10. The AM layer 111 is, for example, a reflective electrode layer that has light reflectivity, and is formed using a metal that is high in reflectivity. For example, the AM layer 111 can be formed from aluminum (Al), silver (Ag), or an alloy of these metals.

The organic EL layer 112 is a light-emitting unit and is formed by laminating a hole transport layer, a light-emitting layer, and an electron transport layer. The organic EL layer 112 is surrounded by the bank 115. In the present embodiment, the organic EL layer 112 is partitioned by the bank 115 for each of the pixels 30.

The transparent electrode layer 113 forms the cathode of the organic EL element 10. The transparent electrode layer 113 may be formed using a transparent metal oxide comprising, for example, an iridium tin oxide (ITO) or an indium zinc oxide (IZO). In the present embodiment, the transparent electrode layer 113 is a common electrode provided as the cathodes of the organic EL elements 10 of all the pixels 30.

The sealing material layer 114 is an insulating layer comprising an insulating material, and is a protection layer that prevents moisture and oxygen from entering the organic EL element 10.

The bank (or, partition) 115 has an opening portion for partitioning the organic EL layer 112 for each subpixel. The AM layer 111 and the organic EL layer 112 are formed in the opening portion of the bank 115.

In the present embodiment, the bank 115 is a pixel bank that partitions the pixels (subpixels) 30 by separating the pixels 30 individually. To be more specific, the bank 115 is formed in a manner that protrusion portions extending in the column direction of the pixels 30 cross protrusion portions extending in the row direction of the pixels 30. Thus, the organic EL layer 112 is formed in the opening portion that is surrounded by the protrusion portions. It should be noted that the bank 115 may be a line bank.

As described thus far, each of the pixels 30 includes: the drive transistor Td that: is disposed on the active-matrix substrate 20; and the organic EL element 10 that is caused by the drive transistor Td to emit light, and includes the AM layer 111 disposed above the active-matrix substrate 20 and the transparent electrode layer 113 disposed above the AM layer 111. The display region in which the plurality of pixels 30 having the above configuration are disposed has a characteristic configuration as follows.

The source line SL and the AM layer 111 are disposed not to overlap each other in a plan view of the active-matrix substrate 20. To be more specific, the source line SL is disposed between the AM layer 111 of the pixel 30a and the AM layer 111 of the pixel 30b in the aforementioned plan view. Thus, the source line SL is disposed between the AM layers 111 of the pixel columns adjacent to each other, along the extending direction of the pixel column. In other words, as shown in FIG. 4A, an SL region defined by the outline of the source line SL does not overlap an AM region defined by the outline of the AM layer 111.

For example, the source line SL and the AM layer 111 are disposed not to overlap each other at all in the aforementioned plan view. However, the source line SL and the AM layer 111 may be disposed to at least partially overlap each other. Thus, when the source line SL and the AM layer 111 are disposed not to overlap each other, this includes not only the case where the source line SL and the AM layer 111 do not overlap each other at all, but also the case where the source line SL and the AM layer 111 do not at least partially overlap each other.

More specifically, the source line SL is disposed below the bank 115. In the present embodiment, the whole of the source line SL is disposed below the bank 115. It should be noted that only a part of the source line SL may be disposed below the bank 115.

Moreover, the power supply line PL is disposed to overlap the AM layer 111 in the aforementioned plan view. TO be more specific, the power supply line PL is disposed adjacent to the source line SL in the aforementioned plan view. Thus, since the source line SL is disposed below the bank 115, the power supply line PL is disposed to overlap the AM layer 111.

[4. Advantageous Effect, Etc]

The display device 1 that includes the plurality of pixels 30 arranged as described thus far can be enhanced in the display quality, as compared to a display device that includes a plurality of pixels arranged to be completely symmetrical with respect to a power supply line PL. For the sake of clarity, a configuration of a display device according to a comparative example is described for reference.

Figure 5:
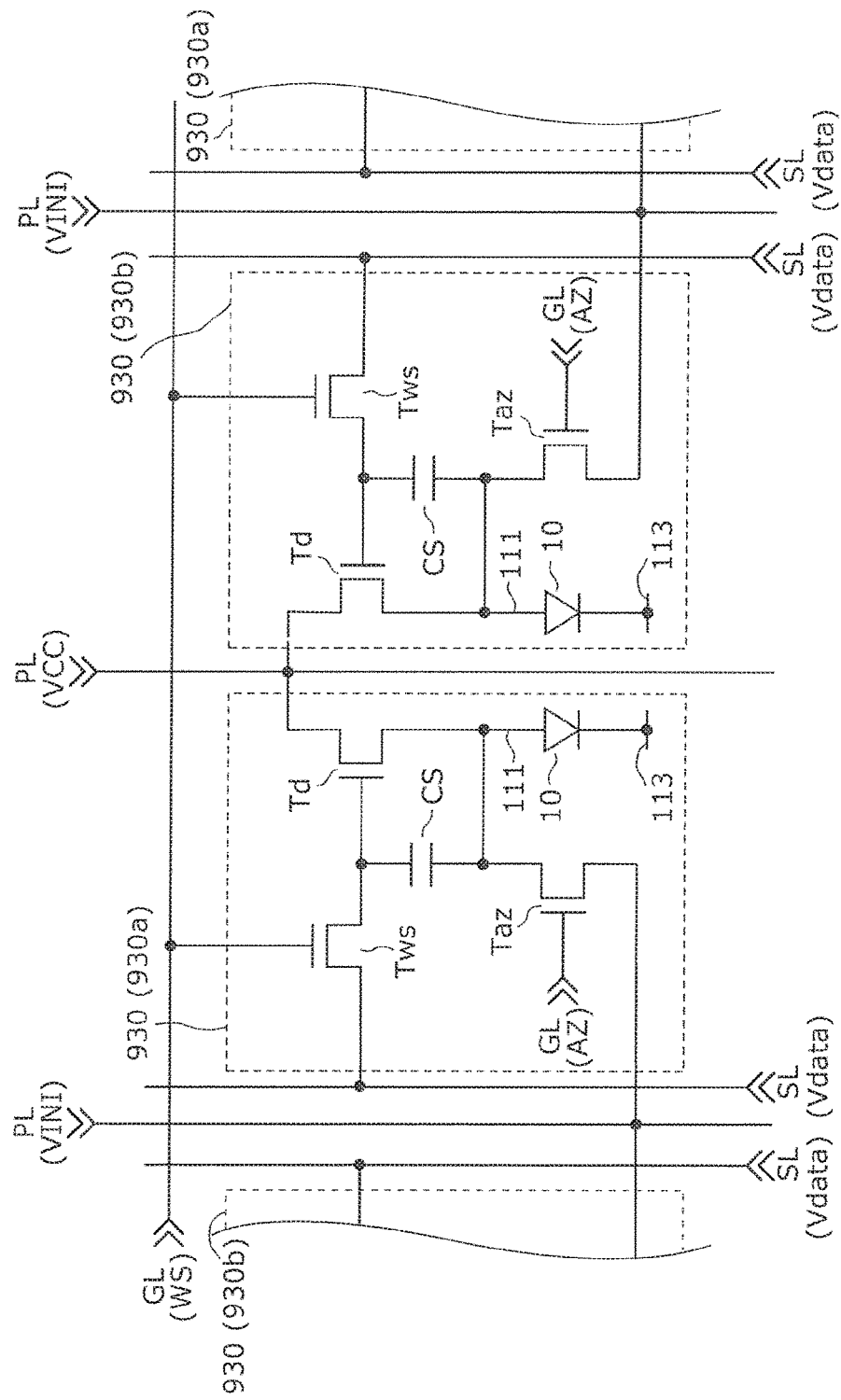
FIG. 5 is a diagram showing a circuit configuration of a pixel according to a comparative example.
Figure 6:
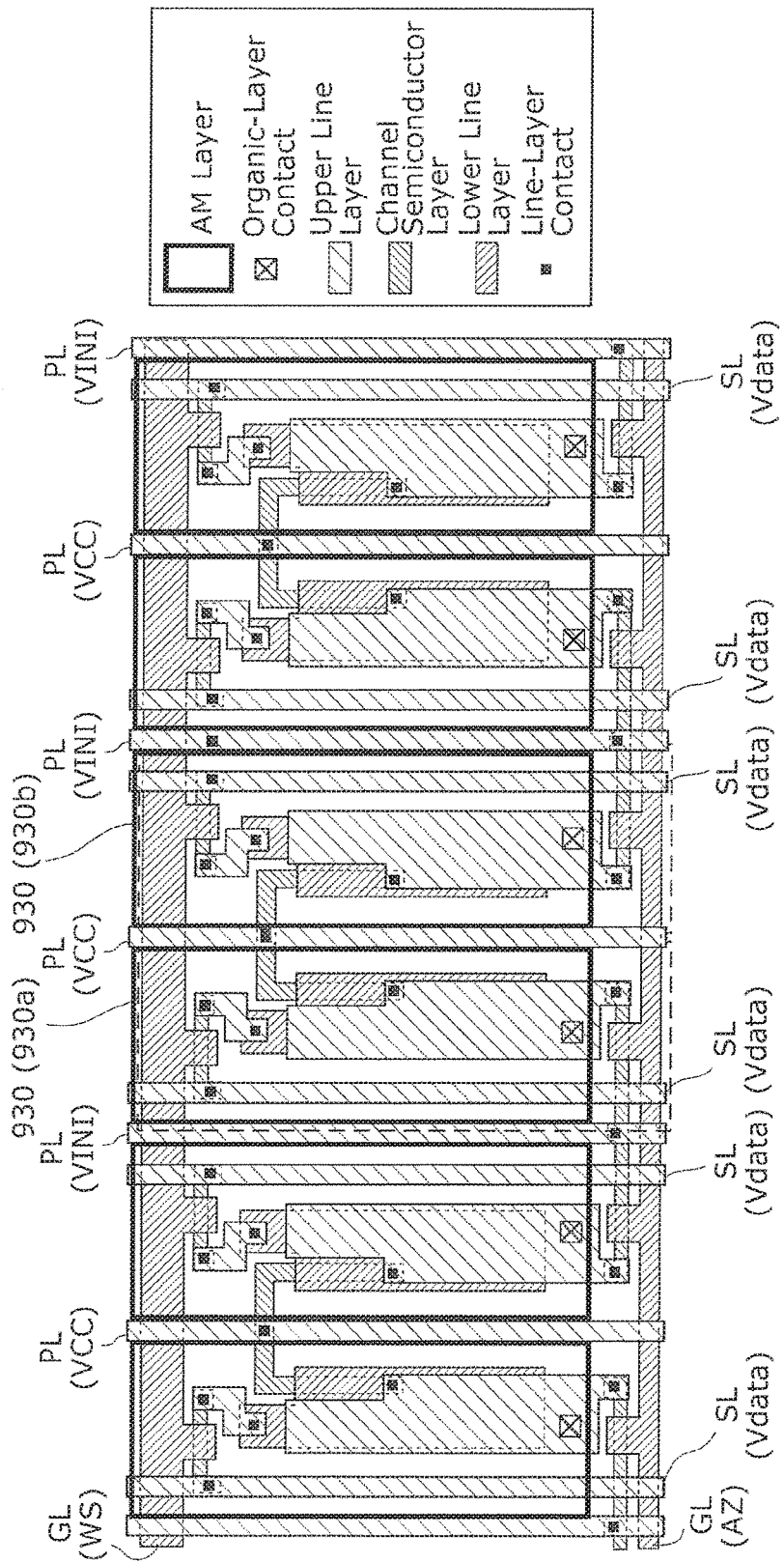
FIG. 6 is a top view showing a wiring layout of the pixel according to the comparative example.

FIG. 5 is a diagram showing a circuit configuration of a pixel 930 included in the display device according to the comparative example. FIG. 6 is a top view showing a wiring layout of the pixel 930 included in the display device according to the comparative example.

The pixel 930 shown in FIG. 5 and FIG. 6 has the same relation of connection in the circuit configuration as the pixel 30 according to the embodiment, and has a wiring layout that is different from the wiring layout of the pixel 30. More specifically, among a plurality of pixels 930 according to the comparative example, a pixel 930*a* and a pixel 930*b* disposed adjacent to each other in the column direction form a completely line-symmetrical pixel layout.

To be more specific, the source line SL is disposed alternately on the left-hand side and on the right-hand side every other pixel column. More specifically, the source line SL is disposed on the left-hand side of the pixel 930*a* and on the right-hand side of the pixel 930*b*.

The display device having the configuration described above according to the comparative example includes a source line SL and an AM layer 111 that overlap each other in the plan view as shown in FIG. 6. Thus, a parasitic capacitance occurs to this overlapping portion, and a voltage variation of the source line SL is thereby transferred to the AM layer 111 via the parasitic capacitance. This can cause a voltage variation, or a so-called crosstalk, to occur to the AM layer 111. Since the AM layer 111 is connected to the node of the pixel circuit in the pixel 930 via a contact, the aforementioned crosstalk results in a voltage variation of this node.

For example, when the pixel 930 has the pixel configuration as shown, the voltage variation of the AM layer 111 causes a variation in the voltage held by the capacitor CS. With this, the organic EL element does not emit light with a luminance corresponding to the data voltage Vdata, and the display quality is thereby degraded.

In particular, the source line SL supplies the data voltage Vdata to the plurality of pixels 930 belonging to the same column, and is thus connected to each of these pixels 930. On this account, in the configuration according to the comparative example, the aforementioned crosstalk occurs along the extending direction of the source line SL (along the column direction). This can be a significant factor that results in degradation of the display quality.

On the other hand, the active-matrix display device according to the present embodiment (the display device in the present embodiment) includes the data line (the source line SL in the present embodiment) and the metal electrode layer (the AM layer 111 in the present embodiment) that are disposed not to overlap each other in the plan view of the substrate (the active-matrix substrate 20 in the present embodiment). Moreover, the two pixels 30*a* and 30*b* share the power supply line PL. Here, these two pixels 30*a* and 30*b* are adjacent to each other in the second direction (the row direction in the present embodiment) that crosses the first direction (the column direction in the present embodiment) in which the power supply line PL is extended.

The arrangement in which the data line and the metal line do not overlap each other as described can reduce the occurrence of parasitic capacitance between the data line and the metal line. Thus, the voltage variation of the data line is less prone to being transferred to the node in the pixel 30, and the display quality can be thereby enhanced. In particular the present embodiment can reduce the crosstalk that may occur along the extending direction of the data line and that can become a significant factor resulting in degradation of the display quality. Hence, the display quality can be further enhanced.

Furthermore, the sharing of the power supply line PL between the two pixels 30*a* and 30*b* can reduce the number of power supply lines PL in the display region in which the plurality of pixels 30 are arranged. Moreover, the reduction in the number of power supply lines PL produces space that allows an increase in the wiring width of the power supply line PL or in the area of the electrode of the capacitor. Thus, the circuit characteristics of the pixel 30 can be enhanced, and the display quality can be thereby further enhanced.

Furthermore, the power supply line PL according to the present embodiment includes: the first power supply line (the power supply line PL that supplies the current to the power supply voltage VCC in the present embodiment) that supplies the light-emitting element (the organic EL element 10 in the present embodiment); and the second power supply line (the power supply line PL that supplies the initialization voltage VINI in the present embodiment) that supplies the voltage that initializes the voltage of the capacitor CS.

More specifically, each of the first power supply line and the second power supply line is shared by the two pixels 30. Thus, as compared to the case where only one of the first and second power supply lines included in the power supply line PL is shared, the number of power supply lines PL in the display region can be further reduced. Hence, the display quality can be further enhanced.

It should be noted that only one of the first power supply line and the second power supply line may be shared by the two pixels 30. For example, a reduction in the voltage drop of the power supply line PL may be considered here. In this case, the first power supply line that requires a large amount of current supply may not be shared, and thus the second power supply line that requires a small amount of current supply may be shared.

Moreover, the first power supply line and the second power supply line are disposed alternately every other pixel 30 along the second direction, according to the present embodiment. To be more specific, only one of the first power supply line and the second power supply line is disposed as the power supply line PL between the two pixels 30 adjacent to each other in the second direction. With this, the efficiency of the wiring layout in the display region can be increased.

It should be noted that the order in which the first power supply line and the second power supply line are arranged does not have to be fixed throughout the display device. For example, the first power supply line and the second power supply line may be arranged in this order along the second direction, and then next the second power supply line and the first power supply line may be arranged in this order along the second direction.

Furthermore, the layout of the two pixels 30 is repeated along the second direction to form the plurality of pixels 30, according to the present embodiment. With this, the number of design man-hours needed to produce the display device 1 can be reduced, for example.

The number of pixels in the layout that is to be repeated to form the plurality of pixels 30 is not limited to two, and may be four for example.

Furthermore, the circuit elements including the drive elements of the two pixels 30*a* and 30*b* that share the power supply line PL are disposed to be symmetrical with respect to this power supply line PL, according to the present embodiment. With this, the number of design man-hours needed to lay out the circuit element can be reduced, for example.

It should be noted that the pixel 30*a* and the pixel 30*b* may be disposed in a manner that the circuit elements of these pixels are not symmetrical with respect to the power supply line PL. With this, the flexibility of layout is increased. Thus, the pixel 30a and the pixel 30b can be arranged to be suitable for circuit characteristics required for the pixel circuit, for example.

Moreover, the power supply line PL is disposed to overlap the metal electrode layer in the plan view of the substrate, according to the present embodiment. With this, the metal electrode layer can have a large area, and an aperture ratio of the display region can be thereby enhanced.

It should be noted that the power supply line PL may be disposed not to overlap the metal electrode layer in the aforementioned plan view. For example, the power supply line PL may be disposed to overlap the bank 115 in the aforementioned plan view.

Furthermore, the data line is disposed below the partition (the bank 115 in the present embodiment) according to the present embodiment. With this, while the data line and the metal electrode layer do not overlap each other, the aperture ratio of the display region can be enhanced.

It should be noted that the data line may not be disposed below the partition. For example, the data line may be disposed between the partition and the metal electrode layer in the aforementioned plan view.

(Modification)

Although the active-matrix display device according to the present disclosure has been described by way of the embodiment above, it should be obvious that the present disclosure is not limited to the embodiment described above. Other embodiments implemented through various changes and modifications conceived by a person of ordinary skill in the art and various kinds of equipment having the active-matrix display device according to the present disclosure may be included in the scope in an aspect or aspects according to the present disclosure, unless such changes, modifications, and equipment depart from the scope of the present disclosure.

For example, in the above description, the pixel 30 has a so-called "3Tr1C" configuration in which the three transistors (the drive transistor Td and the transistors Tws and Taz) and one capacitor (the capacitor CS) are included as the pixel circuit that drives the light-emitting element (the organic EL element 10 in the above description). However, the configuration of the pixel circuit is not limited to this. For example, the pixel 30 may have a so-called "2Tr1C" configuration that includes the drive transistor Td, the transistor Tws, and the capacitor CS. More specifically, the power supply line PL may not include the power supply line that supplies the initialization voltage VINI, and thus may include only the power supply line that supplies the power supply voltage VCC.

Moreover, in the above description, the second power supply line supplies the initialization voltage VINI that initializes the voltage of the capacitor CS to the second electrode of the capacitor CS via the transistor Taz. However, the second power supply line may supply an initialization voltage that initializes the voltage of the capacitor CS to the second electrode of the capacitor CS via, for example, a transistor. It should be noted that the initialization voltage in this configuration may be different from the initialization voltage VINI in the above description.

Furthermore, each of the transistors (the drive transistor Td and the transistors Tws and Taz) the n-channel TFT in the above description. However, each of the transistors may be a p-channel TFT. Moreover, some of the transistors may be the n-channel TFTs and the others may be the p-channel TFTs.

Moreover, each of the transistors is not limited to the top-gate TFT, and may be a bottom-gate TFT. Furthermore, each of the transistors is not limited to the TFT and may be, for example, a bipolar transistor that can achieve the same function as the TFT.

Moreover, the light-emitting element is not limited to the organic EL element that emits light by a current. For example, the light-emitting element may be an inorganic EL element that contains an organic compound that emits light by a voltage. Furthermore, the light-emitting element may have: a cathode formed from a metal electrode layer; and an anode formed from a transparent electrode layer.

Figure 7:
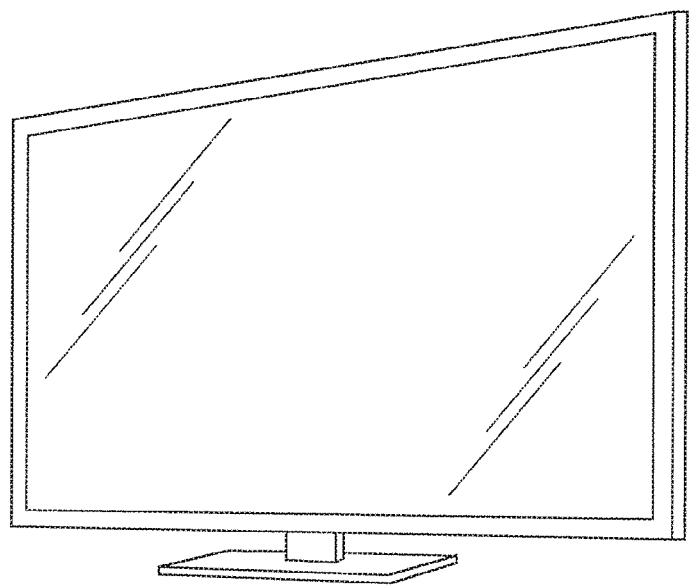
FIG. 7 is an external view of a flat display device.

Moreover, the active-matrix display device according to the present disclosure can be implemented as a flat display device as shown in FIG. 7, for example. FIG. 7 is an external view of the flat display device. The flat display device as shown in the diagram can display video and so forth at a high display quality.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The active-matrix display device according to the present disclosure is useful as, for example, a display device that requires a high display quality.

The invention claimed is:

1. An active-matrix display device comprising:
a plurality of pixels arranged in a matrix, each of the plurality of pixels including:
  a drive element that is disposed on a substrate; and
  a light-emitting element that is caused by the drive element to emit light, and includes a metal electrode layer disposed above the substrate and a transparent electrode layer disposed above the metal electrode layer;
a data line that is disposed on the substrate and supplies data to the plurality of pixels; and
a power supply line that is disposed on the substrate and supplies electric power to the plurality of pixels,
wherein
the power supply line is shared by, among the plurality of pixels, two pixels that are adjacent to each other in a second direction that crosses a first direction in which the power supply line is extended,
the data line and the metal electrode layer are disposed not to overlap each other in a plan view of the substrate,
each of the plurality of pixels further includes a capacitor that is disposed on the substrate and that holds a voltage corresponding to the data,
the power supply line includes:
  a first power supply line that supplies a current to the light-emitting element; and
  a second power supply line that supplies a voltage that initializes a voltage of the capacitor, and
the first power supply line and the second power supply line are disposed alternately every other pixel along the second direction.

2. The active-matrix display device according to claim 1, wherein a layout of the plurality of pixels is formed by repetition of a layout of a pair of pixels along the second direction.

3. The active-matrix display device according to claim 1, wherein the two pixels sharing the power supply line include respective circuit elements that are disposed to be symmetrical with respect to the power supply line, each of the circuit elements including the drive element.

4. The active-matrix display device according to claim 1, wherein the power supply line is disposed to overlap the metal electrode layer in the plan view of the substrate.

5. The active-matrix display device according to claim 1, further comprising
a partition that partitions the plurality of pixels individually,
wherein the data line is disposed below the partition.

* * * * *